United States Patent [19]
Zeskind et al.

[11] 4,099,173
[45] Jul. 4, 1978

[54] DIGITALLY SAMPLED HIGH SPEED ANALOG TO DIGITAL CONVERTER

[75] Inventors: Dale A. Zeskind, Arlington; Bruce C. Anderson, Tewksbury, both of Mass.

[73] Assignee: GTE Laboratories Incorporated, Waltham, Mass.

[21] Appl. No.: 712,445

[22] Filed: Aug. 6, 1976

[51] Int. Cl.$^2$ .................................. H03K 13/175
[52] U.S. Cl. ..................... 340/347 AD; 340/347 M
[58] Field of Search ............... 340/347 AD, 347 M; 324/99 D; 307/360; 328/115

[56] References Cited
U.S. PATENT DOCUMENTS

| | | | |
|---|---|---|---|
| 3,541,315 | 11/1970 | Naydan et al. | 340/347 AD |
| 3,597,761 | 8/1971 | Fraschilla et al. | 340/347 AD |
| 3,646,548 | 2/1972 | VanDoren | 340/347 M |
| 3,860,952 | 1/1975 | Tallent et al. | 358/8 |

OTHER PUBLICATIONS

Schmid, Electronic Analog/Digital Conversions, Van Nostrand Reinhold Company, 1970, pp. 296, 297, 317–322.

*Primary Examiner*—Thomas J. Sloyan
*Attorney, Agent, or Firm*—David M. Keay

[57] ABSTRACT

An analog to digital converter includes a first parallel comparator network receiving the analog signal and continuously producing the most significant bits of the digital signal, a subtractor for removing from the analog signal the amplitude portion corresponding to the most significant bits, a second parallel comparator receiving the modified analog signal and continuously producing the least significant bits of the digital signal, and a sampling buffer responsive to a sampling pulse to provide the digital signal only at the occurrence of the sampling pulse.

6 Claims, 1 Drawing Figure

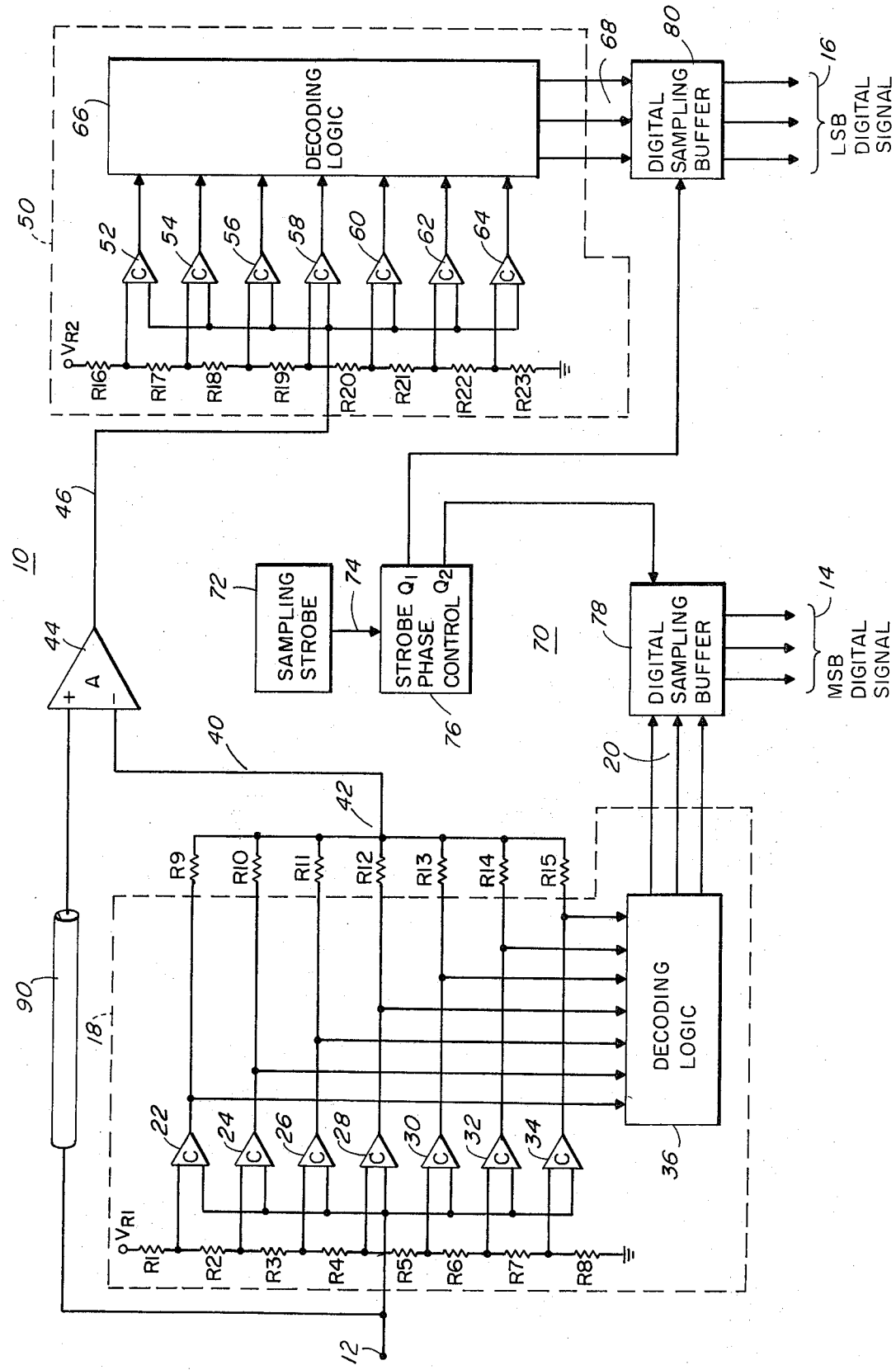

DIGITALLY SAMPLED HIGH SPEED ANALOG TO DIGITAL CONVERTER

BACKGROUND OF THE INVENTION

The present invention relates to analog to digital converters and, more specifically, to those for use with high speed analog signals, such as video television signals and the like.

Known methods of converting television video and other high frequency analog signals into corresponding digital signals usually use analog sample and hold circuits. These systems periodically sample the amplitude of the incoming analog signal and then hold the sample. During the hold period, which is the time between sampling strobe pulses, the amplitude of the analog sample is converted into a corresponding digital number. After the conversion is completed, another analog sample is taken and the hold and conversion sequence is repeated. The actual analog to digital converter, the circuit receiving the output of the sample and hold circuit, can be any one of a number of different types of voltage to digital number converters but must be capable of completing the conversion during the hold period.

While this method of high speed analog to digital conversion is in general use, the analog sample and hold circuit is generally expensive and typically represents at least 25% of the cost of presently available video speed analog to digital converters. Also, high speed sample and hold circuits are difficult to mass produce using monolithic integrated circuit techniques. Accordingly, hybrid circuit techniques are usually employed which require hand adjustment of critical circuit parameters. Also, sample and hold circuits often introduce errors into the digital conversion process since, when commanded to sample, they require a finite amount of time to complete the sample and hold process. The sample that is finally acquired is not necessarily an instantaneous value of the input, but rather, may represent an average of the input signal over the acquisition time. The limitations in these sample and hold circuits place absolute limits on the speed and cost of practical video speed analog to digital converters presently available.

SUMMARY OF THE INVENTION

An object of the invention is to provide an improved analog to digital converter for use with a high speed analog signal such as a television video signal.

It is another object of the invention to provide an analog to digital converter which is uncomplicated and economical to manufacture and which does not require the use of an analog sample and hold circuit.

According to the present invention there is provided a circuit for converting the amplitude of an analog signal into a digital signal. The circuit has a first analog parallel comparator device which is responsive to the analog signal and a series of analog reference signals. The comparator continuously converts the amplitude of the analog signal into a portion of the digital signal representative of the most significant bits. Also, a device generates an analog signal equivalent of the portion of the analog signal representative of the most significant bits of the digital signal. Accordingly, the analog signal equivalent is subtracted from the analog signal to produce a resulting analog signal representative of a fraction of the original analog signal. A second analog parallel comparator is responsive to the resulting analog signal and a second series of analog reference signals for continuously converting the amplitude of the analog signal into a portion of the digital signal representative of the least significant bits thereof. A sampling device, responsive to the continuously occurring portions of the digital signal and to a sampling pulse signal, generates the digital signal representative of the amplitude of the analog signal only at the occurrence of a sampling pulse.

BRIEF DESCRIPTION OF THE DRAWING

In the Drawing:

The sole FIGURE is a block diagram of an analog of digital converter according to the present invention.

DESCRIPTION OF PREFERRED EMBODIMENTS

In an exemplary embodiment of the present invention, as illustrated in the FIGURE, there is provided a circuit, represented generally by the reference numeral 10 for converting the amplitude of an analog signal 12 into a digital signal. The digital signal is shown as including a portion 14 representing the most significant bits (MSB) and a portion 16 representing the least significant bits (LSB). The circuit 10 has a first analog parallel comparator device, represented by the reference numeral 18. The comparator 18 is responsive to the analog signal 12 and a series of analog reference signals for continuously converting the amplitude of the analog signal 12 into a portion 20 representative of the most significant bits. The comparator 18 has a series of analog comparators represented by the reference numerals 22, 24, 26, 28, 30, 32 and 34. Each of the comparators receives as an input the analog signal 12. The comparator 18 also includes a source of a first series of analog reference signals of varying amplitudes. This source is shown as a voltage divider network in which resistors R1 through R8 are coupled in series between a reference voltage identified as $V_{r1}$ and ground. Each of the junctions between these resistors is coupled to one of the comparators. Each comparator provides an output which distinguishes whether the amplitude of the analog signal 12 is greater than or less than the respective reference signal. A decoding logic 36 is responsive to the output of all of the comparators and decodes these outputs into the most significant bits of the digital signal. To more fully understand the operation of the first comparator 18, assume that the output of the comparators is a logical "1" whenever the analog signal is greater than the respective reference signal and that the output is a logical "0" when the analog signal is less than the respective reference signal. The following table illustrates functionally the purpose of the decoding logic 36 in decoding all possible combinations of comparator outputs to the most significant bits of a standard binary digital signal.

| C 22 | C 24 | C 26 | C 28 | C 30 | C 32 | C 32 | B3 | B2 | MSB B1 |
|---|---|---|---|---|---|---|---|---|---|
| 0 | 0 | 0 | 0 | 0 | 0 | 0 | 0 | 0 | 0 |
| 0 | 0 | 0 | 0 | 0 | 0 | 1 | 0 | 0 | 1 |
| 0 | 0 | 0 | 0 | 0 | 1 | 1 | 0 | 1 | 0 |
| 0 | 0 | 0 | 0 | 1 | 1 | 1 | 0 | 1 | 1 |
| 0 | 0 | 0 | 1 | 1 | 1 | 1 | 1 | 0 | 0 |
| 0 | 0 | 1 | 1 | 1 | 1 | 1 | 1 | 0 | 1 |
| 0 | 1 | 1 | 1 | 1 | 1 | 1 | 1 | 1 | 0 |
| 1 | 1 | 1 | 1 | 1 | 1 | 1 | 1 | 1 | 1 |

The circuit 10 includes a device for generating an analog signal equivalent at line 40 of the portion of the analog signal 12 representative of the most significant bits of the digital signal. This device, represented generally by the reference numeral 42, includes resistors R9 through R15, each of which is coupled to one of the comparator outputs. The signal at the junction of these resistors accordingly is representative of that portion of the analog signal used to create the most significant bits of the digital signal. The analog signal equivalent at line 40 is subtracted from the analog signal 12 in a differential amplifier 44. The amplifier 44 produces at its output 46 a resulting analog signal representative of the difference between the analog input signal and its three most significant bits equivalent.

The circuit 10 also includes a second analog comparator network 50 which is responsive to the resulting analog signal at 46 and a second series of analog reference signals for continuously converting the amplitude of the resulting analog signal into a portion of the digital signal representative of the least significant bits. The comparator 50 includes a series of analog comparators represented by the reference numerals 52, 54, 56, 58, 60, 62 and 64, each of which receives the resulting analog signal as an input. Also, there is provided a voltage divider network for generating the second series of analog reference signals of varying amplitudes. This network comprises resistors R16 through R23 which are coupled in series between a reference voltage identified as $V_{R2}$ and ground. Each junction between the resistors is coupled to one of the comparators so that each comparator provides an output which distinguishes whether the amplitude of the resulting analog signal is greater than or less than the respective reference signal. A decoding logic 66, which is identical with the decoding logic 36 of the first parallel comparator 18 and which is responsive to the output at 68 of all of the comparators from the comparator network 50, decodes the output into the least significant bits 16 of the digital signal.

A sampling device which is responsive to the continuously occurring portions of the digital signal and to a sampling pulse signal generates the digital signal representative of the amplitude of the analog signal 12 only at the occurrence of the sampling pulses. This sampling device, represented by the reference numeral 70, includes a source 72 of a sampling strobe whose output 74 is coupled to a strobe phase control 76. Each output of the strobe phase control 76, identified as Q1 or Q2, is coupled to one of a pair of digital sampling buffers 78 and 80. Q1 is delayed with respect to Q2 to compensate for the delay in the generation of the LSB's with respect to the generation of the MSB's; this delay is the difference in time between that for processing the LSB's via the delay line 90, the amplifier 44, and the comparator 50 and that for processing the MSB's via only the comparator 18. The digital sampling buffers may include a master/slave flip-flop for each of the bits.

There are several additionally preferred features according to the present invention. First, there are $2^n-1$ comparators in each of the comparator networks 18 and 50 where $n$ is an integer equal to the number of least or most significant bits. In the exemplary embodiment where the analog signal is a baseband video signal, the number of bits of the digital word is six; accordingly, $n$ in the embodiment is equal to three. Thus, seven comparators are all that are necessary for converting the analog signal into the three most significant bits, and seven additional comparators are all that are needed for converting the analog signal into the three least significant bits. Also, in the comparator 18 the series of analog reference signals vary from each other by decending factors of amplitude representative of the maximum amplitude of the least significant bits. More specifically, the following indicates the generalized/amplitudes of the various reference voltages for the comparator 18 as a function of the maximum amplitude (X) of the analog video signal.

| | |
|---|---|
| $V_R$ | 8/8Xv |
| V22 | 7/8Xv |
| V24 | 6/8Xv |
| V26 | 5/8Xv |
| V28 | 4/8Xv |
| V30 | 3/8Xv |
| V32 | 2/8Xv |
| V34 | 1/8Xv |

In another feature of the invention, the amplitude of the first and second series of the analog reference signals are equal. To accomplish this, means are provided for amplifying the resulting analog signal at 46. This may be accomplished in the embodiment by the provision of the amplifier 44 having a gain of $2^n$ which in the embodiment is equal to 8. Also, the circuit 10 preferably includes a device, such as a delay line 90, for delaying the analog signal 12 prior to the coupling thereof to the amplifier 44 to compensate for the delay in the analog signal equivalent at 40 due to its processing by the comparator 18.

In operation, the analog signal 12 is first converted into a continuous digital signal in a very high speed analog to digital converter stage. The output of this digital signal at 20 and 68 is a binary value proportional to the amplitude of the analog signal 12. The analog to digital converter portion, which in the embodiment is the comparator networks 18 and 50, is built using a standard design, but preferably employs ultra-fast emitter coupled logic which enables it to continuously follow the analog input signal up to an analog input frequency of about 4.5 MHz. The continuous digital output then drives a series of digital buffers 78 and 80, each of which includes a standard D-type master/slave flip-flop for each bit. The outputs of these buffers remain constant until a strobe signal is received. When the strobe signal arrives, the outputs of the buffers change to equal the binary values at their respective inputs at the time of the strobe. These values are then held at the output, no matter what signals are present at the input, until another strobe pulse arrives. Therefore, the continuous digital output of the analog to digital converter stage is sampled digitally by these buffers, the sample values being held constant at the buffer outputs until a new sample is taken. This arrangement is in direct contrast to the known method in which the analog, rather than the digital, signal is sampled.

The embodiment of the present invention is intended to be merely exemplary and those skilled in the art shall be able to make numerous variations and modifications of it without departing from the spirit and scope of the present invention. All such variations and modifications are intended to be within the scope of the present invention as defined by the appended claims.

We claim:

1. A circuit for converting the amplitude of an analog signal into a digital signal including:

first analog parallel comparator means responsive to a continuously variable analog signal and a series of analog reference signals for continuously converting the amplitude of the analog signal into a portion of the digital signal representative of the most significant bits thereof;

said first analog parallel comparator means comprising a series of analog comparators for continuously receiving the analog signal, means for generating the first series of analog reference signals of varying amplitudes, each reference signal being coupled to one of the comparators so that each comparator continuously provides an output which distinguishes whether the amplitude of the continuously variable analog signal is greater than or less than the amplitude of the respective reference signal, first decoder means responsive to the output of all of the comparators for continuously decoding the outputs into the most significant bits of the digital signal, and first storage means coupled to the first decoder means and operable to sample and store the most significant bits of the continuously occurring digital signal in response to a strobe signal;

means for continuously generating an analog signal equivalent of the portion of the analog signal representative of the most significant bits of the digital signal;

subtraction means for continuously subtracting the analog signal equivalent from the analog signal to produce a continuously variable resulting analog signal representative of a fraction of the analog signal;

delay means for delaying the analog signal prior to the coupling thereof to the subtraction means to compensate for the delay in the analog signal equivalent due to the first analog parallel comparator means;

second analog parallel comparator means responsive to the resulting analog signal and a second series of analog reference signals for continuously converting the amplitude of the resulting analog signal into a portion of the digital signal representative of the least significant bits thereof;

said second analog parallel comparator means comprising a series of analog comparators for continuously receiving the resulting analog signal, means for generating the second series of reference signals of varying amplitudes, each reference signal being coupled to one of the comparators so that each comparator continuously provides an output which distinguishes whether the amplitude of the resulting analog signal is greater than or less than the amplitude of the respective reference signal, second decoder means responsive to the output of all of the comparators for continuously decoding the outputs into the least significant bits of the digital signal, and second storage means coupled to the second decoder means and operable to sample and store the least significant bits of the continuously occurring digital signal in response to a strobe signal; and means coupled to the first and second storage means and responsive to a sampling pulse signal to apply a strobe signal to the first storage means and a strobe signal to the second storage means, the strobe signal to the second storage means being delayed with respect to the strobe signal to the first storage means to compensate for the difference in delays in the processing time of the delay means, subtraction means, and second analog comparator means and in the processing time of the first analog parallel comparator means whereby a digital signal representative of the amplitude of the analog signal is generated only at the occurrence of a sampling pulse.

2. The circuit according to claim 1 wherein the series of comparators in the first and second analog parallel comparator means each includes $2^n-1$ comparators, where $n$ is an integer equal to the respective number of most or least significant bits.

3. The circuit according to claim 2 wherein $n$ is equal to three to provide a digital signal having 6 bits.

4. The circuit according to claim 2 wherein the amplitudes of the first and second series of analog reference signals are equal and said subtraction means includes means for amplifying the resulting analog signal.

5. The circuit according to claim 4 wherein the amplifying means amplifies the resulting analog signal by a actor of $2^n$.

6. The circuit according to claim 2 wherein the first and second series of analog reference signals vary by a factor of $2^n$.

* * * * *